US011735486B2

(12) United States Patent
Tedeschi et al.

(10) Patent No.: US 11,735,486 B2
(45) Date of Patent: Aug. 22, 2023

(54) PROCESS MONITOR DEVICE HAVING A PLURALITY OF SENSORS ARRANGED IN CONCENTRIC CIRCLES

(71) Applicant: Applied Materials, Inc., Santa Clara, CA (US)

(72) Inventors: Leonard Tedeschi, San Jose, CA (US); Kartik Ramaswamy, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 230 days.

(21) Appl. No.: 17/026,013

(22) Filed: Sep. 18, 2020

(65) Prior Publication Data

US 2021/0005518 A1 Jan. 7, 2021

Related U.S. Application Data

(63) Continuation of application No. 15/009,705, filed on Jan. 28, 2016, now Pat. No. 10,818,561.

(51) Int. Cl.
*H01L 21/66* (2006.01)
*H01L 21/67* (2006.01)
*G01D 21/02* (2006.01)

(52) U.S. Cl.
CPC ........ *H01L 22/10* (2013.01); *H01L 21/67253* (2013.01); *G01D 21/02* (2013.01)

(58) Field of Classification Search
USPC ....................................................... 73/865.8
See application file for complete search history.

(56) References Cited

U.S. PATENT DOCUMENTS 6,244,121 B1   6/2001 Hunter
6,366,690 B1*  4/2002 Smilansky ......... G01N 21/9501
                                              348/126

(Continued)

FOREIGN PATENT DOCUMENTS

JP   2004-153119    5/2004
JP   2005-516400    6/2005

(Continued)

OTHER PUBLICATIONS

International Search Report and Written Opinion from PCT/US2016/066409 dated Apr. 5, 2017, 10 pgs.

(Continued)

*Primary Examiner* — Peter J Macchiarolo
*Assistant Examiner* — Mohammed E Keramet-Amircolai
(74) *Attorney, Agent, or Firm* — Schwabe, Williamson & Wyatt, P.C.

(57) ABSTRACT

Embodiments include process monitoring devices and methods of using such process monitoring devices. In one embodiment, the process monitoring device includes a substrate. The process monitoring device may also include a plurality of sensors formed on a support surface of the substrate. According to an embodiment, each sensor is capable of producing an output signal that corresponds to a processing condition. Furthermore, embodiments include a process monitoring device that includes a network interface device that is formed on the substrate. According to an embodiment each of the plurality of sensors is communicatively coupled to the network interface device. The network interface device allows for the output signals obtained from the sensors to be wirelessly transmitted to an external computer during processing operations.

14 Claims, 7 Drawing Sheets

(56) References Cited

U.S. PATENT DOCUMENTS

| | | |
|---|---|---|
| 6,468,816 B2 | 10/2002 | Hunter |
| 6,642,853 B2 | 11/2003 | Hunter |
| 6,677,166 B2 | 1/2004 | Hunter |
| 6,696,362 B2 | 2/2004 | Rossman et al. |
| 6,830,650 B2 | 12/2004 | Roche et al. |
| 6,895,831 B2 | 5/2005 | Hunter |
| 7,166,480 B2 | 1/2007 | Shiraishi et al. |
| 7,473,029 B2 * | 1/2009 | Hutter ............... G01K 7/02 374/E7.004 |
| 7,521,915 B2 | 4/2009 | Herchen et al. |
| 7,567,072 B2 | 7/2009 | Orvek et al. |
| 7,627,184 B2 | 12/2009 | Dei et al. |
| 8,700,199 B2 | 4/2014 | Erturk et al. |
| 8,823,933 B2 | 9/2014 | Bonciolini et al. |
| 9,618,588 B2 | 4/2017 | Ausserlechner |
| 2003/0115978 A1 | 6/2003 | Moehnke et al. |
| 2004/0098216 A1 | 5/2004 | Ye et al. |
| 2005/0136604 A1 | 6/2005 | Al-Bayati et al. |
| 2006/0234398 A1 | 10/2006 | Gluschenkov et al. |
| 2008/0228419 A1 | 9/2008 | Renken |
| 2008/0239314 A1 | 10/2008 | Bonciolini et al. |
| 2009/0302002 A1 * | 12/2009 | Collins ............... H01J 37/321 156/345.35 |
| 2010/0045272 A1 | 2/2010 | Kondo |
| 2010/0121487 A1 * | 5/2010 | Kawaguchi ....... H01L 21/68707 414/222.01 |
| 2010/0202253 A1 * | 8/2010 | Nakamura ............ G06F 1/1626 367/155 |
| 2011/0315985 A1 | 12/2011 | Oba et al. |
| 2012/0069174 A1 * | 3/2012 | Ye ..................... G01N 25/72 348/92 |
| 2012/0098926 A1 * | 4/2012 | Kweon ............... H04N 5/3696 348/308 |
| 2012/0245724 A1 * | 9/2012 | Erturk ................. H01L 28/20 257/467 |
| 2013/0057866 A1 * | 3/2013 | Hillebrand .......... G06K 9/6201 356/421 |
| 2013/0155390 A1 | 6/2013 | Jensen et al. |
| 2014/0262031 A1 | 9/2014 | Beiostotskiy |
| 2015/0137796 A1 | 5/2015 | Ausserlechner |
| 2015/0309127 A1 * | 10/2015 | Ausserlechner ... G01R 19/0092 324/252 |
| 2015/0369583 A1 | 12/2015 | Potter, Sr. |
| 2017/0131217 A1 * | 5/2017 | Tedeschi ........... H01L 21/67253 |
| 2017/0303346 A1 * | 10/2017 | Kang ..................... F24C 7/083 |

FOREIGN PATENT DOCUMENTS

| | | |
|---|---|---|
| JP | 2006-505940 | 2/2006 |
| JP | 2006-513583 | 4/2006 |
| JP | 2009-059880 | 3/2009 |
| JP | 2009-244174 | 10/2009 |
| JP | 2009-535855 | 10/2009 |
| JP | 2013-518370 | 5/2013 |

OTHER PUBLICATIONS

First Official Letter from Taiwan Patent Application No. 106100785 dated Nov. 25, 2020, 12 pgs.

Non-Final Office Action from U.S. Appl. No. 15/009,705 dated Aug. 22, 2017, 13 pgs.

Final Office Action from U.S. Appl. No. 15/009,705 dated Feb. 14, 2018, 10 pgs.

Non-Final Office Action from U.S. Appl. No. 15/009,705 dated Jul. 26, 2018, 20 pgs.

International Preliminary Report on Patentability from PCT/US2016/066409 dated Jul. 31, 2018, 8 pgs.

Final Office Action from U.S. Appl. No. 15/009,705 dated Feb. 8, 2019, 19 pgs.

Non-Final Office Action from U.S. Appl. No. 15/009,705 dated Sep. 27, 2019, 19 pgs.

Final Office Action from U.S. Appl. No. 15/009,705 dated Mar. 6, 2020, 11 pgs.

Harash Ajjam, Individual Air-Borne Particle Mass Measurement Using High-Frequency Micromechanical Resonators,' IEEE Sensors Journal, vol. 11, No. 11, Nov. 2011.

Decision of Rejection from Japanese Patent Application No. 2018-539036 dated Mar. 16, 2021, 10 pgs.

Notice for Reasons of Rejection from Japan Patent Application No. 2018-539036 dated Oct. 12, 2020) 13 pgs.

Notice of First Office Action from Chinese Patent Application No. 201680079917.2 dated Nov. 1, 2022, 13 pgs.

* cited by examiner

PROCESS MONITOR DEVICE HAVING A PLURALITY OF SENSORS ARRANGED IN CONCENTRIC CIRCLES

CROSS-REFERENCE TO RELATED APPLICATIONS

This application is a continuation of U.S. patent application Ser. No. 15/009,705, filed on Jan. 28, 2016, the entire contents of which are hereby incorporated by reference herein.

BACKGROUND

1) Field

Embodiments relate to the field of semiconductor processing and, in particular, to devices and methods for characterizing processing in real time.

2) Description of Related Art

Deposition and removal rates are typically measured by processing a substrate for a given amount of time, and then measuring the amount of film deposited or removed using a film thickness measurement tool (e.g., ellipsometer). The issue with this technique is that only the end result of the process can be determined. As such, the real time changes to the film during the course of the processing cannot be determined. In some cases, the use of optical emission spectroscopy (OES) can provide some real time information about the plasma, but still lacks the ability to determine the effect that the plasma has on the surface of the substrate. Additionally, OES is not suitable for use with remote plasmas.

SUMMARY

Embodiments include process monitoring devices and methods of using such process monitoring devices. In one embodiment, the process monitoring device includes a substrate. The process monitoring device may also include a plurality of sensors formed on a support surface of the substrate. According to an embodiment, each sensor is capable of producing an output signal that corresponds to a processing condition. Furthermore, embodiments include a process monitoring device that includes a network interface device that is formed on the substrate. According to an embodiment each of the plurality of sensors is communicatively coupled to the network interface device. The network interface device allows for the output signals obtained from the sensors to be wirelessly transmitted to an external computer during processing operations.

A method for monitoring a substrate processing operation is also included in some embodiments. In an embodiment the process monitoring method may include initiating a processing operation on a process monitoring device with a processing station. For example, the processing station may be any processing tool, such as a chamber in a deposition or etching process. According to an embodiment, the process monitoring device includes a plurality of sensors distributed across a support surface of the process monitoring device. Each of the sensors produce sensor outputs that correspond to a processing condition in the processing chamber. According to an embodiment, the method may also include receiving the sensor outputs from the process monitoring device during the processing operation. In some embodiments, the method may also include synchronizing a clock on the process monitoring device with a clock associated with the processing station.

The above summary does not include an exhaustive list of all embodiments. It is contemplated that all systems and methods are included that can be practiced from all suitable combinations of the various embodiments summarized above, as well as those disclosed in the Detailed Description below and particularly pointed out in the claims filed with the application. Such combinations have particular advantages not specifically recited in the above summary.

DETAILED DESCRIPTION

Devices and methods used for monitoring processing conditions on a substrate during a processing operation are described in accordance with various embodiments. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

Existing techniques for verifying processing operations used in various substrate processing operations are time consuming and expensive. For example, when a deposition process needs to be verified, a sample substrate is placed in the deposition chamber and a layer is deposited over the surface of the substrate. Thereafter, the substrate is removed from the deposition chamber, and analyzed using a different tool. For example, a metrology tool, such as an ellipsometer, may be used to determine the final film thickness obtained by the deposition process.

This typical verification process has several disadvantages. First, the process verification uses more than one tool. The additional metrology tool takes up valuable space in a fabrication facility. Additionally, the use of multiple tools necessitates additional substrate transportation operations, and therefore increases the time needed to verify the process. Secondly, the process verification is only able to determine the thickness of the film after the process is completed. As such, current process verification techniques do not allow for the change in thickness over time to be determined in real time.

Accordingly, embodiments include a process monitoring device that allows for process monitoring to occur during the processing. As such, embodiments eliminate the need for expensive metrology equipment and allow for real time analysis of the conditions on the substrate during the processing operations. Furthermore, embodiments allow for the analysis of a plurality of different process parameters at the same time. For example, film thickness (e.g., during deposition or etching processes), presence or absence of particles, mass, substrate temperature, chuck temperature, surface charge, magnetic field strength, specific gas concentration, electron energy distribution function (EEDF) of a plasma, voltage direct current (VDC), or the like, or the like may be monitored during a processing operation.

Monitoring the real-time change of multiple different processing conditions may allow for process optimization in addition to process verification. The ability to monitor more than one process parameter may allow for experimental designs (DOEs) to be implemented that can be used to analyze how a change in one process condition effects change in other process conditions. For example, the relationship between the VDC and surface temperature can be determined by running a process recipe that includes changes in the VDC and monitoring how the surface temperature changes in response to the change in VDC. Understanding the effects that each processing condition has on the substrate surface allows for more robust processes and hardware. Additionally, chamber matching may also be improved since small variances between tools can be monitored and controlled.

It will be understood that the process monitoring device and methods described below could be used in any form factor or process where real time process monitoring is beneficial. More particularly, although process monitoring devices and methods are described with respect to wafer processing for the fabrication of integrated circuits, the devices and methods may also be adapted for use in other technologies, such as displays in the electronics industry and/or photovoltaic cells in the solar industry.

Figure 1A:
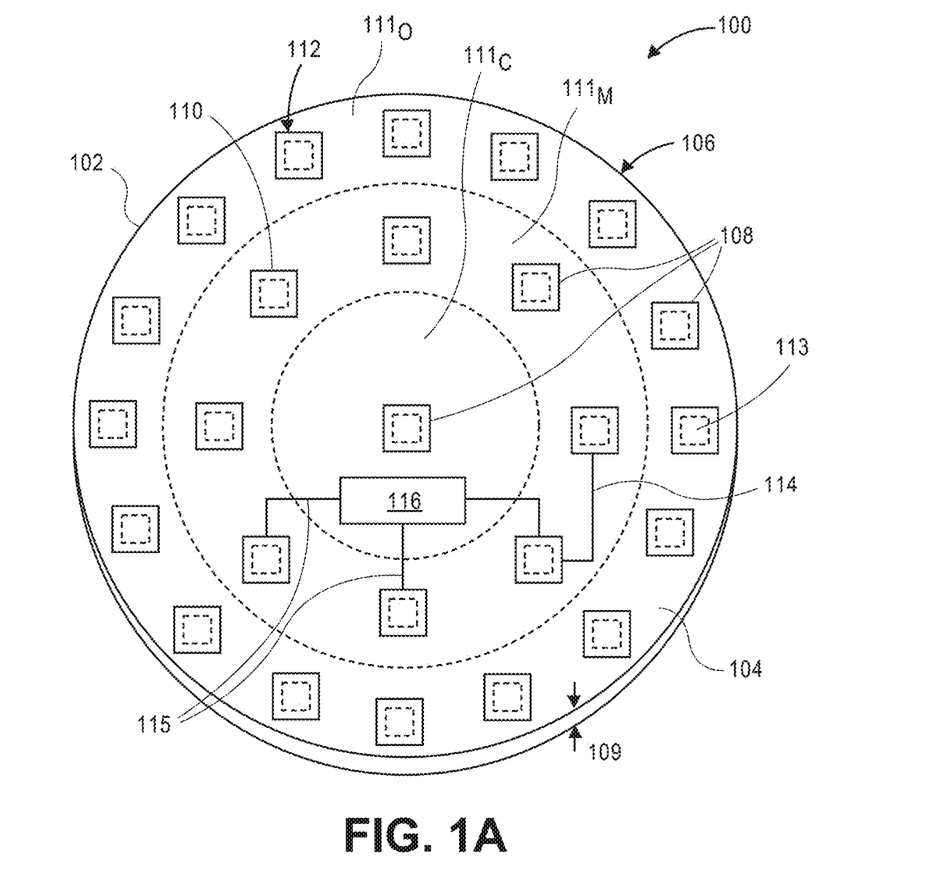
FIG. 1A is an illustration of a process monitoring device that includes a plurality of sensor banks, in accordance with an embodiment.

Referring now to FIG. 1A, an illustration of a process monitoring device 100 is shown in accordance with an embodiment. Process monitoring device 100 may include a substrate 102 that has an overall form factor and/or a same material and shape as a semiconductor wafer. In one embodiment, substrate 102 may be at least partially composed of a semiconductor material. For example, substrate 102 may be a crystalline silicon material, a crystalline III-V semiconductor material, a silicon-on-insulator (SOI), or the like. Furthermore, substrate 102 may have a wafer form factor that is essentially disc-shaped and includes a support surface 104 having a diameter 106. Support surface 104 may be an upper surface of the disc, and a bottom surface of substrate 102 (not shown) may be spaced apart from support surface 104 by a thickness 109. In an embodiment, the wafer form factor of substrate 102 includes diameter 106 between 95 to 455 mm (e.g., diameter 106 may nominally be 100 mm, 200 mm, 300 mm, or 450 mm). Furthermore, the wafer form factor of substrate 102 may include thickness 109 less than 1 mm (e.g., 525 µm, 775 µm, or 925 µm). Thickness 109 may also be greater than 1 mm (e.g., several millimeters up to 10 mm). Accordingly, process monitoring device 100 may be manufactured using readily available wafer materials and typical wafer manufacturing processes and equipment, and may essentially simulate a semiconductor wafer when processed in a wafer processing tool. According to an additional embodiment, the substrate 102 may have a form factor of any type of substrate that is typically processed in a substrate processing tool. For example, glass panels that are used in display technologies (e.g., thin-film-transistor (TFT) based displays) may also be used as the substrate 102.

Process monitoring device 100 may include one or more sensor banks 108 fabricated or mounted on support surface 104 at predetermined locations. According to an embodiment, each sensor bank 108 may have one or more sensors and/or patterned features (e.g., fins, trenches, etc.). Individual sensors and patterned features are not illustrated in FIG. 1A in order to not obscure the figure, and will be described in greater detail below. In an embodiment, a plurality of sensor banks 108 (e.g., tens to millions), may be built or placed over support surface 104. Each sensor bank 108 may have a known location. For example, a first sensor bank may be located at a first location 110, and a second sensor bank may be located at a second location 112. Second location 112 may have a known position relative to first location 110, or relative to some other reference point on process monitoring device 100.

Sensor banks 108 may be distributed across support surface 104 randomly or arranged in a predetermined pattern. When a random distribution is used, the absolute or relative locations of each of the sensor banks 108 may still be predetermined and known. In an embodiment, predetermined patterns used for the sensor banks may include, a grid pattern, a concentric circle pattern, a spiral pattern, etc. For example, sensor banks 108 shown in FIG. 1A are distributed across support surface 104 in ordered concentric circles. Both random patterns and predetermined patterns may be achieved using known etching and/or deposition processes to build sensor banks 108 at precise locations on support surface 104 of process monitoring device 100. Alternatively, sensor banks 108 may be fabricated as discrete components that are mounted on the support surface 104 at predetermined locations.

In an embodiment, the sensor banks 108 are arranged to provide process monitoring information at locations that are predicted to have the greatest degree variation in the processing conditions during a processing operation. For example, the temperature of the substrate 102 or exposure to the plasma may vary across the surface of the substrate. Accordingly, some embodiments may include forming one or more sensor banks 108 at different zones 111 of the substrate (e.g., a center zone $111_C$, a middle zone $111_M$, an outer zone $111_O$, etc.) Each zone may have the same number of sensor banks 108. Additional embodiments may include zones with different numbers of sensor banks 108. For example, the outer perimeter of a substrate typically undergoes greater process variation than the center of the substrate 102. Therefore, the outer zone may have more sensor banks 108 than a center zone of the substrate.

Process monitoring device 100 may include one or more regions of electronic circuitry 113 formed on the substrate 102. The electronic circuitry 113 of process monitoring device 100 may be communicatively coupled to one or more sensor banks 108 formed on the support surface 104 of substrate 102. The electronic circuitry 113 are illustrated with a dashed line to indicate that the electronic circuitry 113 may not be formed on the support surface 104 of the substrate 102. For example, the electronic circuitry 113 may be embedded in the substrate 102, as will be described in greater detail below. According to an embodiment, the electronic circuitry 113 may be electrically coupled to the sensor banks 108 by vias and/or traces.

In the illustrated embodiment, each sensor bank 108 is paired with electronic circuitry 113. According to additional embodiments, more than one sensor bank 108 may be paired with each region of electronic circuitry 113. Additionally, embodiments may include an electronic circuitry hub 116. The electronic circuitry hub 116 may be communicatively coupled to each of the individual regions of electronic circuitry 113 with wired or wireless connections. For example, an electrical trace 114 embedded in (or formed over) the substrate 102 may connect one or more regions of electronic circuitry 113 with the electronic circuitry hub 116 in series, or one or more regions of electronic circuitry 113 may be connected with the electronic circuitry hub 116 in parallel by respective electrical traces 115. Thus, electrical connections may be made between sensor banks 108 and/or sensor banks 108 may be connected to electronic circuitry hub 116, using electrical traces, electrical leads, vias, and other known types of electrical connectors. In some embodiments, the electronic circuitry hub 116 is omitted.

Figure 1B:
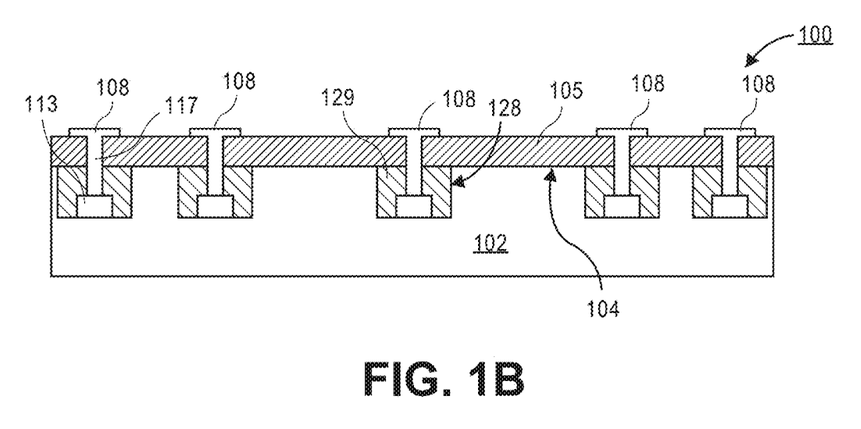
FIG. 1B is an illustration of a process monitoring device that includes a plurality of sensor banks formed on a replaceable layer, in accordance with an embodiment.

Referring now to FIG. 1B, a cross-sectional illustration of a process monitoring device 100 is shown according to an additional embodiment. In the illustrated embodiment, a replaceable layer 105 is formed between the support surface 104 and the sensor banks 108. Embodiments that include a replaceable layer 105 may improve the longevity of process monitoring device 100 by allowing for the sensor banks 108 to be replaced. For example, the sensor banks 108 and the replaceable layer 105 may be removed with an etching or polishing process after a predetermined number of uses. Alternatively, the sensor banks 108 and the replaceable layer may be removed after the performance of the sensors begins to deteriorate (e.g., failure of sensors due to mechanical fatigue or other damage).

According to an embodiment, the removal of the sensor banks 108 and the replaceable layer 105 may allow for electrical connections that are formed directly on, or embedded in the substrate 102 to be preserved. Therefore, additional processing to form the electrical connections for subsequently formed replacement sensor banks may not be needed.

The replaceable layer 105 may be any suitable material that can be deposited over the substrate 102. For example, the replaceable layer 105 may be an oxide, a nitride, a polysilicon, a single crystal semiconductor material, or the like. The material for the replaceable layer 105 may also be chosen to match the material that will be exposed during processing of production wafers. Additionally, the replaceable layer 105 may be a material that the sensors in the sensor banks 108 will be formed from. In such an embodiment, the sensor banks may be formed into the replaceable layer 105 instead of being formed above the replaceable layer 105, as is shown in FIG. 1B.

As described above, each region of electronic circuitry 113 may be embedded in the substrate 102. For example, a cavity 128 may be formed into the substrate 102. The electronic circuitry 113 may then be formed in the cavity 128. In the illustrated embodiment, the electronic circuitry 113 is shown as extending up from the bottom surface of the cavity 128. For example, the electronic circuitry 113 may be a die that is mounted in the cavity 128. However, embodiments are not limited to such configurations. For example, the electronic circuitry 113 may be fabricated directly into the substrate 102 (e.g., when the substrate is a semiconductor substrate). A cap layer 129 may be formed in the cavity 128 in order to isolate the electronic circuitry 113 from processing conditions during substrate processing operations. In an embodiment the top surface of cap layer 129 may be substantially coplanar with a top surface of the substrate 102. Furthermore, it is to be appreciated that references to a "support surface" of the substrate may also include a top surface of the cap layer 129. Therefore, in some embodiments, the sensor banks 108 are formed over the top surface of the cap layer 129. In order to provide an electrical connection from the sensor banks 108 to the electronic circuitry 113, a via 117 may be formed through the cap layer 129 (and the replaceable layer 105, if present). The cap layer 129 may be any material that can be deposited over the substrate 102. For example, the cap layer 129 may be an oxide, a nitride, a polysilicon, an epitaxially grown semiconductor material, or the like.

Figure 2:
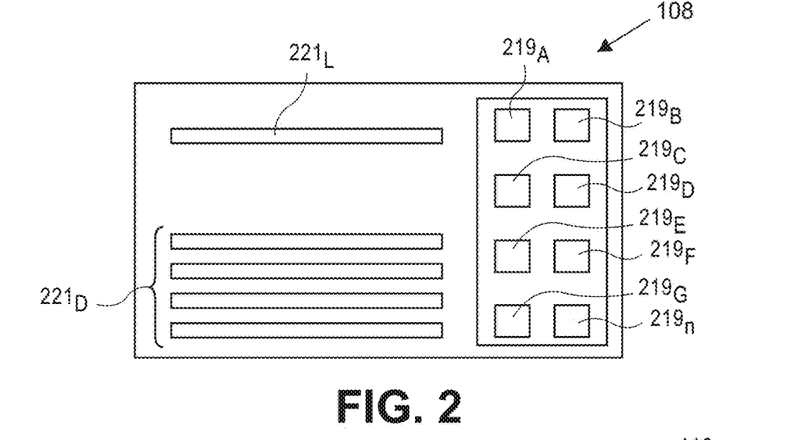
FIG. 2 is an illustration of a sensor bank that may be formed on a process monitoring device, in accordance with an embodiment.

Referring now to FIG. 2, a sensor bank 108 is illustrated in greater detail in accordance with an embodiment. Embodiments may include a sensor bank 108 that includes one or more sensors 219. For example, sensor bank 108 may include sensors $219_A$ -$219_n$. In an embodiment, each sensor 219 may be a different type of sensor that allows for monitoring different process conditions. For example, the sensors 219 may include sensors for measuring changes in film thickness, presence or absence of particles, mass, substrate temperature, chuck temperature, surface charge, magnetic field strength, specific gas concentration, EEDF of a plasma, VDC, or the like. Specific examples of how these sensors 219 may be implemented are disclosed in greater detail below.

In some embodiments, the sensor bank 108 may also include one or more patterned features 221. The patterned features 221 may include trenches, fins, contact holes, dual damascene features, or any other patterned feature that may be present on a production substrate. The patterned features 221 may also be formed from a material that is the same material that will be processed in production wafers in order to provide processing conditions that are similar to those that will be encountered during the fabrication of actual devices. The patterned features 221 may be formed over the support surface 104 or formed into the support surface 104. Additional embodiments may include forming the patterned features 221 over or into the replaceable layer 105.

According to an embodiment, sensor bank 108 may include more than one of a particular type of sensor 219. Having more than one of a given type of sensor has several advantages. One advantage is that if one of the sensors 219 becomes inoperable, the second sensor 219 that monitors the same processing conditions may be used as a backup. The inclusion of backup sensors may extend the useful life of the process monitoring device.

Additionally, the sensors may be formed proximate to different patterned features 221. For example, sensor $219_A$ and sensor $219_G$ may both be film thickness sensors, such as a resonator. Sensor $219_A$ is located proximate to an isolated patterned feature $221_L$ and sensor $219_G$ is located proximate to a plurality of densely spaced patterned features $221_D$. Accordingly, any loading effects that may result from the density of the patterned features may be monitored as well.

Figure 3:
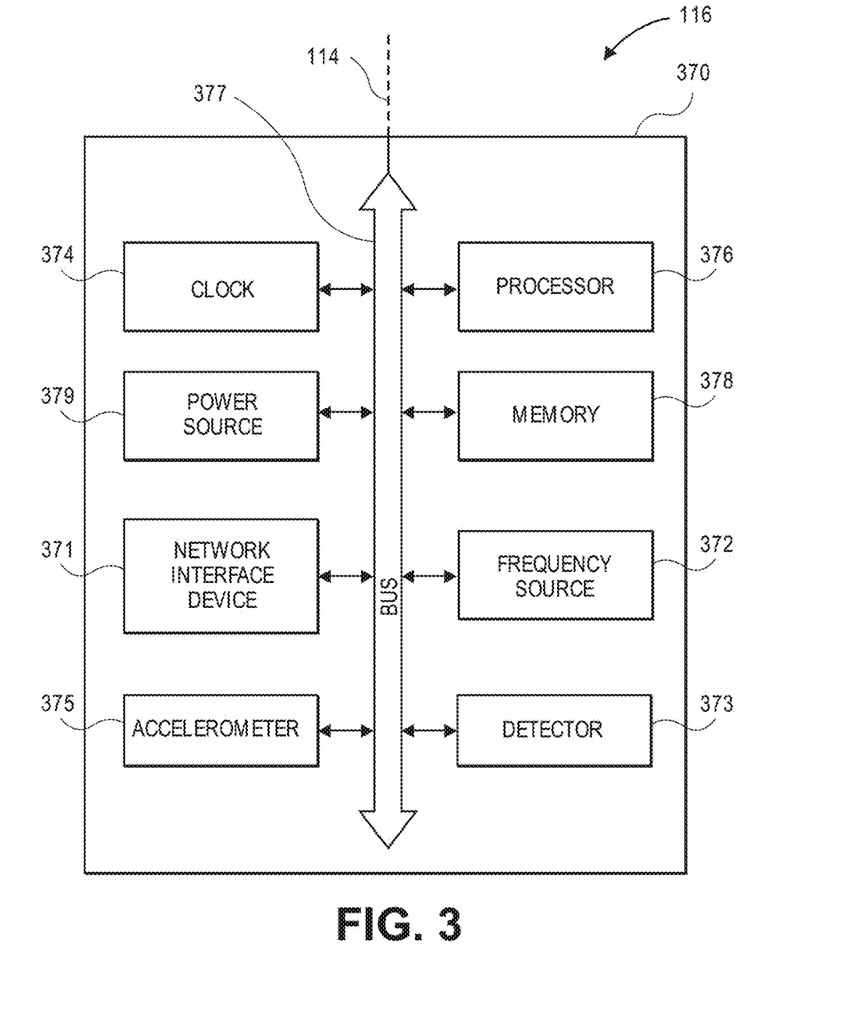
FIG. 3 is an illustration of electronic circuitry that is mounted on the process monitoring device, in accordance with an embodiment.

Referring now to FIG. 3, an illustration of a block diagram of electronic circuitry hub 116 of a process monitoring device 100 is illustrated in accordance with an embodiment. While reference in FIG. 3 is made to the electronic circuitry hub 116, it is to be appreciated that one or more of the components of electronic circuitry hub 116 may be included at each region of electronic circuitry 113 distributed across the substrate 102. Additionally, in some embodiments, the electronic circuitry hub 116 may be omitted, and one or more of the components described in FIG. 3 may be provided in each region of electronic circuitry 113. Electronic circuitry hub 116 of process monitoring device 100 may be enclosed or supported in a housing 370, or may be exposed. Housing 370 and/or electronic components of electronic circuitry hub 116 may be mounted on support surface 104 of substrate 102. In an embodiment, one or more component of electronic circuitry hub 116 is embedded within the substrate 102. Forming electronic circuitry embedded within the substrate 102 provides more surface area on the support surface 104 for forming additional sensor banks 108. Electronic circuitry hub 116 may nonetheless be placed in electrical connection with sensors 219 in each sensor bank 108 through one or more electrical trace, electrical lead, or via, even when mounted on opposite sides of substrate 102.

Electronic circuitry hub 116 of process monitoring device 100 may include a clock 374 mounted on substrate 102. The clock 374 may be an electronic circuit having an electronic oscillator (e.g., a quartz crystal) to output an electrical signal having a precise frequency, as is known in the art. Thus, clock 374 may be configured to output a time value corresponding to the electrical signal. The time value may be an absolute time value independent of other operations, or the time value may be synchronized to other clocks in substrate processing tools (described in greater detail below). For example, clock 374 may be synchronized to a system clock of substrate processing tools, such that the time value output by clock 374 corresponds to a system time value and/or system operations that are output or controlled by the system clock. Clock 374 may be configured to initiate the output of the time value when a particular process operation occurs. For example, electronic circuitry hub 116 may include an accelerometer 375 that triggers clock 374 to begin outputting the time value when process monitoring device 100 ceases movement. Thus, the time value may provide information about when process monitoring device 100 is loaded into a particular chamber of substrate processing tool.

Electronic circuitry hub 116 of process monitoring device 100 may include a processor 376 mounted on substrate 302. Processor 376 may be operably coupled (e.g., electrically connected by bus 377 and/or traces 114/115) to one or more sensors 219 and to clock 374. Processor 376 represents one or more general-purpose processing devices such as a microprocessor, central processing unit, or the like. More particularly, processor 376 may be a complex instruction set computing (CISC) microprocessor, reduced instruction set computing (RISC) microprocessor, very long instruction word (VLIW) microprocessor, a processor implementing other instruction sets, or processors implementing a combination of instruction sets. Processor 376 may also be one or more special-purpose processing devices such as an application specific integrated circuit (ASIC), a field programmable gate array (FPGA), a digital signal processor (DSP), network processor, or the like.

Processor 376 is configured to execute processing logic for performing the operations described herein. For example, processor 376 may be configured to transmit and/or record the predetermined location of a sensor 219, the time value output by clock 374, and an output signal from the sensor 219. Accordingly, processor 376 may be configured to transmit and/or record a real time processing conditions that occur on the substrate during a processing operation.

The processor 376 may also determine which sensors 219 will be monitored. For example, a given process condition may not be needed during a particular processing operation. As such, the output signal from the sensor 219 that is detecting that particular process condition is not transmitted and/or recorded. Additionally, firmware or software accessible to the processor 376 or an external computer that receives output signals from the network interface device 371 may provide instructions that prevent the transmission and/or recording of one or more of the output signals from the sensors 219. Such an embodiment may be useful to allow for all possible sensors to be formed on every process monitoring device 100, and then allow for customization of the capabilities of each process monitoring device 100 by providing different firmware/software. As such, manufacturing costs may be reduced since a single mask (or mask set) is needed to produce every type of process monitoring device 100.

In some embodiments, electronic circuitry hub 116 may include a network interface device 371. The network interface may communicate data through the use of modulated electromagnetic radiation through a non-solid medium. The network interface device 371 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, etc. Processor 376 may communicate with the network interface device 371 via bus 377 or other electrical connection. Thus, processor 376 may be operably coupled to network interface device to transmit the output signals from the sensors 219 and the time value output by clock 374 to an external device.

According to an embodiment, the network interface device 371 is communicatively coupled to the sensors 219 so that an output signal from each of the sensors 219 may be sent to the network interface device 371 without being processed by a processor or any other component first. The network interface device 371 may then transmit the output signals to a computing device that is external to the process monitoring device 100. As such, embodiments may include a process monitoring device 100 that has electronic circuitry that includes a power source 379 and a network interface device 371, since the output signals from the sensors 219 may not need to be processed or stored locally. Instead, embodiments allow for data from the sensor output signals to be processed or recorded on an external device.

Offloading the processing and storage functions to an external device has several benefits. First, the power consumption of the device is reduced. Accordingly, a battery may not be needed since a capacitor bank, piezoelectric springs, or the like may provide sufficient power to transmit the output signals. Additionally, reducing the complexity of the electronic circuitry by removing unneeded components provides a more reliable and less expensive device.

Electronic circuitry hub 116 of process monitoring device 100 may optionally include a memory 378 mounted on substrate 102. Memory 378 may include one or more of a main memory (e.g., read-only memory (ROM), flash memory, dynamic random access memory (DRAM) such as synchronous DRAM (SDRAM) or Rambus DRAM (RDRAM), etc.), a static memory (e.g., flash memory, static random access memory (SRAM), etc.), or a secondary memory (e.g., a data storage device). Processor 376 may communicate with memory 378 via bus 377 or other electrical connection. Thus, processor 376 may be operably coupled to memory 378 to record the output signals from the sensors 219 and the time value output by clock 374 in the memory 378.

Electronic circuitry hub 116 of process monitoring device 100 may include a power source 379 mounted on substrate 302. Power source 379 may include a battery, a capacitor bank, or another known power supply. Power source 379 may be electrically connected to one or more of the components of process monitoring device 100 through bus 377, to power the connected components. For example, power source 379 may be electrically connected to one or more of the sensors 219, clock 374, processor 376, or memory 378, to power the one or more of the sensors 219, clock 374, processor 376, or memory 378.

Electronic circuitry hub 116 of process monitoring device 100 may include additional components electrically connected to the components of process monitoring device 100 described above. More particularly, electronic circuitry hub 116 may include a frequency source 372 (e.g., a broad frequency source) or a detector 373. Frequency source 372 and/or detector 373 may be mounted on substrate 102. Frequency source 372 and detector 373 may have particular application in relation to specific sensors 219 of process monitoring device 100. Thus, further description of frequency source 372 and detector 373 is reserved for the corresponding sensor discussion below.

Figure 4A:
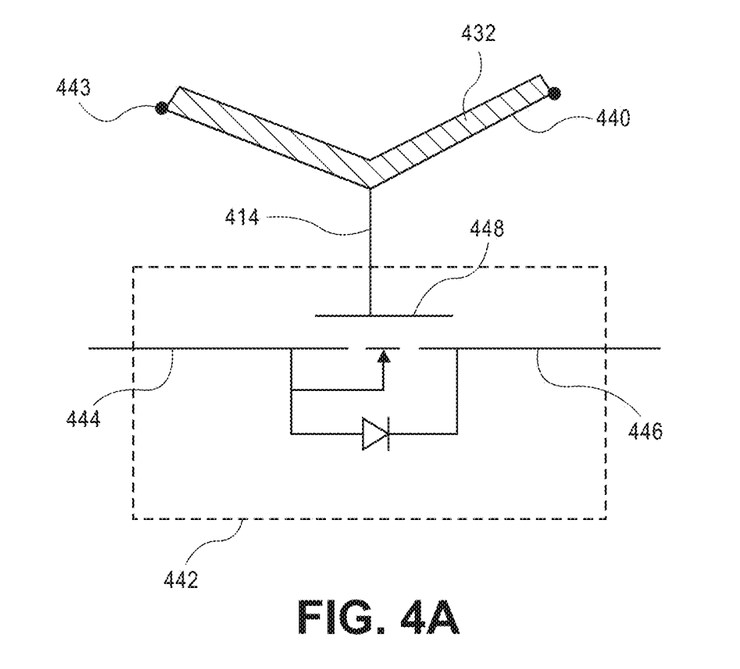
FIGS. 4A-4C are illustrations of sensors that may be included in a sensor bank, in accordance with an embodiment.

Referring now to FIG. 4A, a schematic illustration of a transistor sensor type of sensor 219 of a process monitoring device 100 is illustrated in accordance with an embodiment. In an embodiment, one or more sensors 219 of process monitoring device 100 include a transistor sensor 219. Transistor sensor 219 may include one or more transistors (e.g., a metal oxide semiconductor field effect transistor (MOSFET) 442. MOSFET 442 may include a source 444, a drain 446, and a gate 448. Transistor sensor 219 may also include a collector 440. Collector 440 may be formed to have a surface on which a film 432 may be deposited. In an embodiment, the film 432 may be a film that will change in thickness during a processing operation (e.g., the film thickness will increase during a deposition process, and be reduced during an etching process). Accordingly, embodiments include a collector 440 that is a material that is etch resistant to the etching process used to reduce the thickness of the film 432.

In an embodiment, collector 440 is electrically connected to MOSFET 442. For example, collector 440 may be electrically connected to gate 448 of MOSFET 442 through electrical trace 414. Collector 440 may be physically separated from MOSFET 442, however, the subcomponents may be electrically connected with each other. Thus, MOSFET 442 may be configured to detect an increase or decrease in the thickness of the film 432 on collector 440 even when collector 440 is located at a predetermined location spaced apart from MOSFET 442.

In an embodiment, the collector 440 may include a profile defined by an outer rim 443. A shape of outer rim 443 when viewed in a downward direction may be circular, rectangular, or any other shape. Furthermore, collector 440 may be flat (i.e., collector 440 may have an essentially planar upper surface) or collector 440 may have a conical upper surface as shown in FIG. 4A. In an embodiment, collector 440 is not a separate structure from MOSFET 442, but instead, is incorporated into MOSFET 442. For example, collector 440 may be a collection area on gate 448 of MOSFET 442.

In an embodiment, an output signal of transistor sensor 219 may be a threshold voltage of MOSFET 442 as measured across gate 448. The threshold voltage may correspond directly to the thickness of film 432 on collector 440. For example, the threshold voltage may have a first value when no film 432 is on the collector 440 and the threshold voltage may have a second value (different than the first value) when a film 432 is on collector 440. Thus, the threshold voltage of MOSFET 442 may change in response to the thickness of the film 432 on collector 440. Processor 376 may be configured to detect a change in the threshold voltage, and thus, process monitoring device 100 can note the change in the thickness of the film 432 at the location of transistor sensor 219. Additional embodiments may include transmitting the output signal (i.e., the threshold voltage) to an external computing device with the network interface device 371.

Figure 4B:
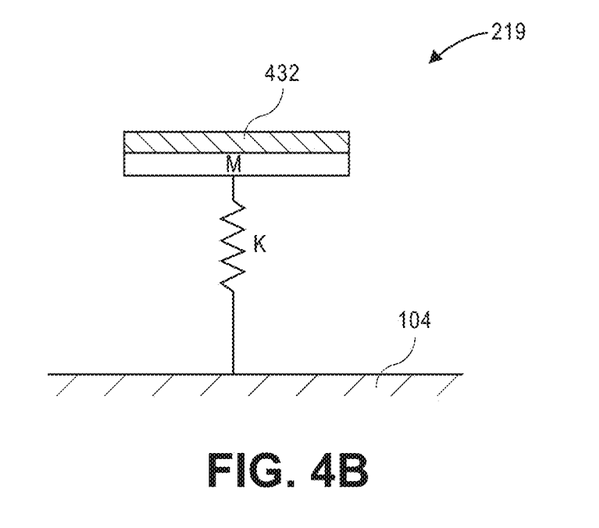

Referring now to FIG. 4B, a schematic illustration of a resonator type of sensor 219 of a process monitoring device 100 is illustrated in accordance with an embodiment. In an embodiment, one or more sensors 219 of process monitoring device 100 include a resonator type sensor 219. A resonator sensor 219 may be a suitable resonant mass sensor, such as a Quartz Crystal Microbalance (QCM), Surface Acoustic Wave (SAW), or Film Bulk Acoustic Resonators (FBAR), which are all known to quantify the cumulative mass of a film 432 deposited on their surfaces. A description of the complexity and variety of resonators is not described here in favor of a simplified description for the purpose of brevity and ease of understanding. The resonator sensor 219 may be formed in one or more sensor banks 108 at predetermined locations across support surface 104 of substrate 102 or over a replaceable layer 105 (if present). Each resonator sensor 219 may have a characteristic frequency (e.g., a resonant frequency) as is known in the art. For example, without going into great detail, resonator sensor 219 may be represented by a simple mass-spring system as is shown in FIG. 4B. The characteristic frequency of resonator sensor 219 may be inversely proportional to a mass M of the resonator sensor 219. For example, the characteristic frequency may be proportional to sqrt(k/M) of the micro-resonator system, where 'M' corresponds to mass M and 'k' corresponds to a proportionality constant of the resonator sensor 219. Thus, it will be recognized that the characteristic frequency shifts when a thickness of the film 432 on the resonator sensor 219 changes. Accordingly, the thickness of the film 432 may be monitored during the deposition or etching of the film 432.

Figure 4C:
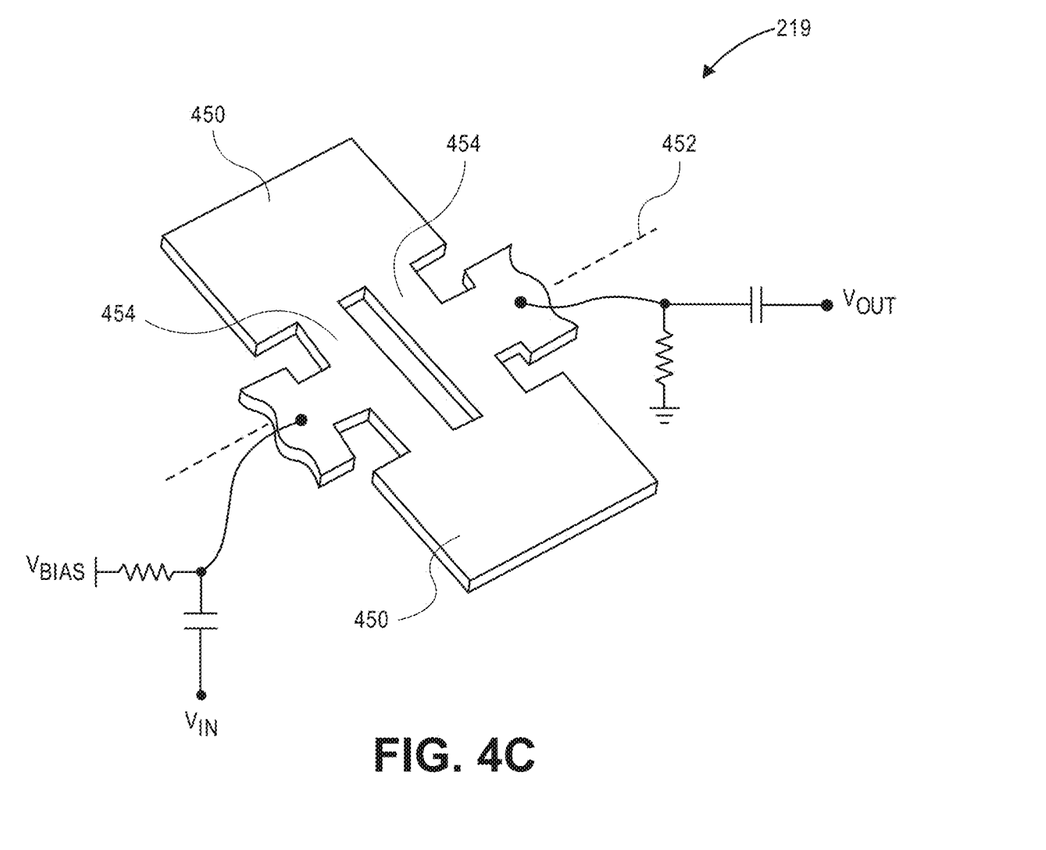

Referring now to FIG. 4C, a schematic illustration of a resonator type of sensor 219 of a process monitoring device 100 is illustrated in accordance with an embodiment. One exemplary type of resonator sensor 219 that may be used is a microelectromechanical system (MEMS) resonant mass sensor, such as a thermally actuated high-frequency single crystalline silicon resonator. Such resonator type sensors 219 may be fabricated on the support surface 104 or the replaceable layer 105 as individual devices or arrays using single mask processes. A resonator sensor 219 may include two pads 450 on either side of a plane of symmetry 452. A fluctuating electrical current may be passed between the two pads 450 to cause an alternating current (AC) ohmic loss component in the current path. In an embodiment, most of the ohmic loss occurs in thin pillars 454 that interconnect the pads 450. Thin pillars 454 may be centrally located and extend between the pads 450 in a direction orthogonal to plane of symmetry 452. Fluctuating temperature generated in pillars 454 may cause an AC force, and an alternating thermal stress in pillars 454, to actuate resonator sensor 219 in an in-plane resonant mode. In the in-plane resonant mode, pads 450 having mass 'M' vibrate in opposite directions. Thus, at resonance, resonator sensor 219 includes a characteristic frequency of the vibrating pads 450, and a resistance of pillars 454 is modulated by an alternating mechanical stress due to a piezoresistive effect. Accordingly, there is a detectable small signal motional current in resonator sensor 219 corresponding to the characteristic frequency.

To detect a shift in the characteristic frequency of resonator sensor 219, frequency source 372 and detector 373 may be incorporated in electronic circuitry 113/116 of process monitoring device 100. Frequency source 372 may be a broad frequency source that is used to excite resonator sensor 219. Detector 373 may monitor the characteristic frequency of resonator sensor 219, and detect changes of the characteristic frequency. For example, detector 373 may output a signal corresponding to the characteristic frequency (e.g., an output voltage or current) to processor 376. Processor 376 may be configured to receive the output voltage and recognize the change of the characteristic frequency. Thus, when a change in the output voltage and/or when the characteristic frequency of resonator sensor 219 changes, process monitoring device 100 can note the change as a change in the thickness of the film 432. The time and location of change in the thickness of the film 432 may also be recorded as well in order to provide process monitoring of the change in the thickness of the film 432 at a particular location during the entire course of the processing operation. For example, as mass M of resonator sensor 219 increases (e.g., as the thickness of the film 432 increases) the characteristic frequency will shift down, allowing process monitoring device 100 to capture a history of film thickness increase. Alternatively, when a processor and memory are not included in the process monitoring device 100, the output signal may be transmitted to an external computing device by the network interface device 371 to provide real time process monitoring of the processing operation.

While exemplary transistor sensors and resonant sensors are provided herein, it is to be appreciated that any sensor may be used to monitor different processing conditions during a processing operation. Any sensor that is able to generate an output signal (e.g., an output voltage, an output current, a frequency response, a time measurement, or the like) that corresponds to a processing condition (e.g., film thickness, presence or absence of particles, mass, substrate temperature, chuck temperature, surface charge, magnetic field strength, specific gas concentration, EEDF of a plasma, VDC, or the like) may be used as a sensor 219 in a sensor bank 108, in accordance with various embodiments. Accordingly, embodiments allow for processing conditions on the substrate and in the processing station to be monitored in real-time.

Figure 5:
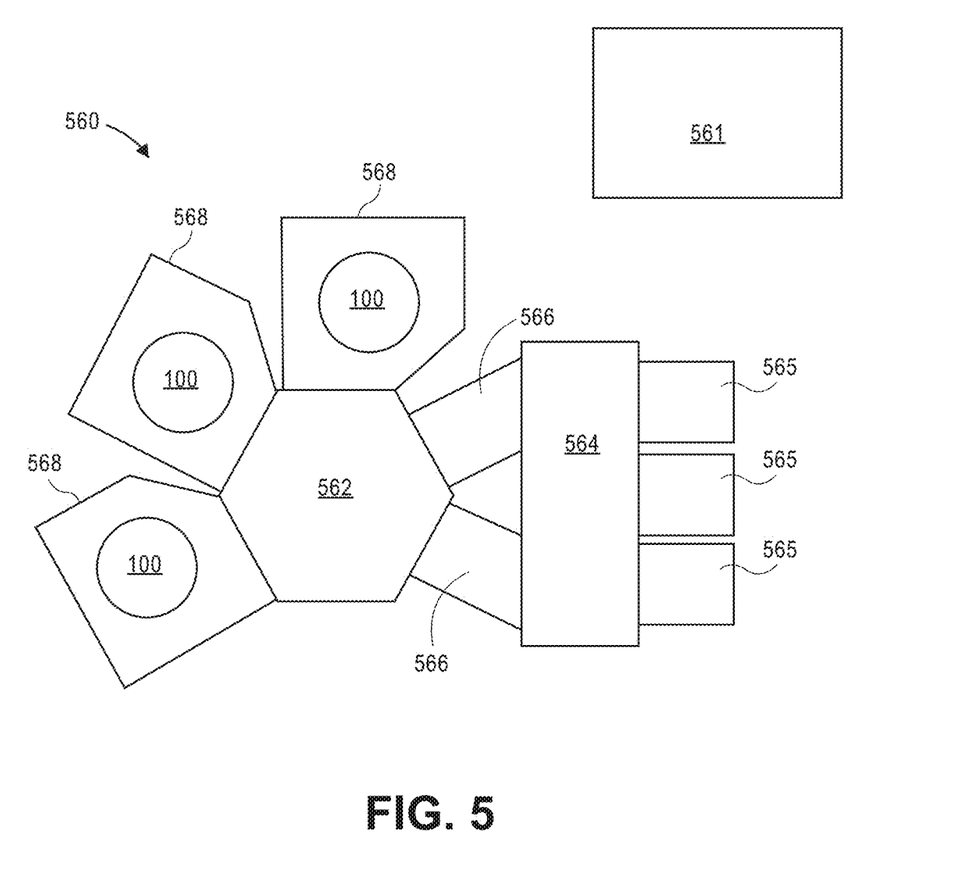
FIG. 5 is an illustration of a process monitoring device that is placed in a chamber of a substrate processing tool, in accordance with an embodiment.

According to an embodiment, a process monitoring device 100 may be used in conjunction with any processing station. In some embodiments, one or more processing stations may be included in a substrate processing tool. A plan view illustration of one exemplary substrate processing tool 560 is illustrated in FIG. 5 in accordance with an embodiment. A substrate processing tool 560 may include a buffer chamber 562 physically connected to a factory interface 564 by one or more load locks 566. The factory interface 564 may be able to accommodate one or more front opening unified pods (FOUPs) 565 used to transport substrates between tools in a fabrication facility. In embodiments where the process monitoring devices 100 have a form factor similar to those of production substrates, the same equipment (e.g., FOUPs, substrate transfer robots (not shown), etc.) may be used to transport the process monitoring devices 100 within a fabrication facility.

One or more processing chambers 568 may be physically connected to buffer chamber 562 directly or by one or more respective load locks (not shown). Buffer chamber 562 may essentially act as an intermediate volume, larger than respective volumes of processing chambers 568, that remains at a low pressure, albeit at a pressure higher than the process pressures within processing chambers 568. Thus, a substrate (e.g., a process monitoring device or production substrate) may be moved between chambers of substrate processing tool 560 under vacuum (or near vacuum) conditions during the manufacture of semiconductor devices. This movement may be enabled by various devices included in the substrate processing tool 560 (e.g., robotic arms, shuttles, etc.) that are not shown in order to not overly complicate the illustration.

Various manufacturing operations may be performed in processing chambers 568. For example, at least one of processing chambers 568 may be a plasma etch chamber, a deposition chamber, a chamber of a lithography tool, or any other semiconductor process tool chamber. As such, processing chamber 568 may be used to perform manufacturing processes under vacuum conditions, atmospheric conditions, or any other pressure regime. Each sensor 219 of process monitoring device 100 may be configured to sense a change in a given processing condition on the substrate 102 (e.g., film thickness, presence or absence of particles, mass, substrate temperature, chuck temperature, surface charge, magnetic field strength, specific gas concentration, EEDF of a plasma, VDC, or the like) during processing operations implemented by the various processing chambers 568 or by any processing station.

Substrate processing tool 560 may be coupled to an external computer or server 561. The external computer 561 may be used to provide recipes for processing operations to be performed on substrates, monitor the flow of substrates throughout the facility, and generally to provide an automated fabrication process. The substrate processing tool 560 may be wired or wirelessly coupled to the external computer 561. In an embodiment, the computer 561 may also be incorporated into the processing tool 560. In an embodiment, the computer 561 may receive output signals from each of the chambers 568 that correspond to chamber processes, such as voltages, gas flow rates, pressure settings, or the like. Additionally, the computer 561 may be wirelessly coupled to the process monitoring device 100 by the network interface device 371 of the process monitoring device 100.

As such, embodiments allow for real time process conditions on the substrate 102 or in the processing station to be transmitted during the processing operations to the external computer 561. The external computer 561 may be configured to overlay the process conditions obtained by the process monitoring device 100 with the recorded processing station settings and/or processing station sensor readings in order to provide analysis of how changes to a process recipe alter the conditions (e.g., film thickness, presence or absence of particles, mass, substrate temperature, chuck temperature, surface charge, magnetic field strength, specific gas concentration, EEDF of a plasma, VDC, or the like) over the course of a processing operation. Accordingly, processing recipes can be verified that a given result is produced, or refined to produce an improved result (e.g., a process that has more uniform or consistent result across the entire surface of the substrate).

Figure 6:
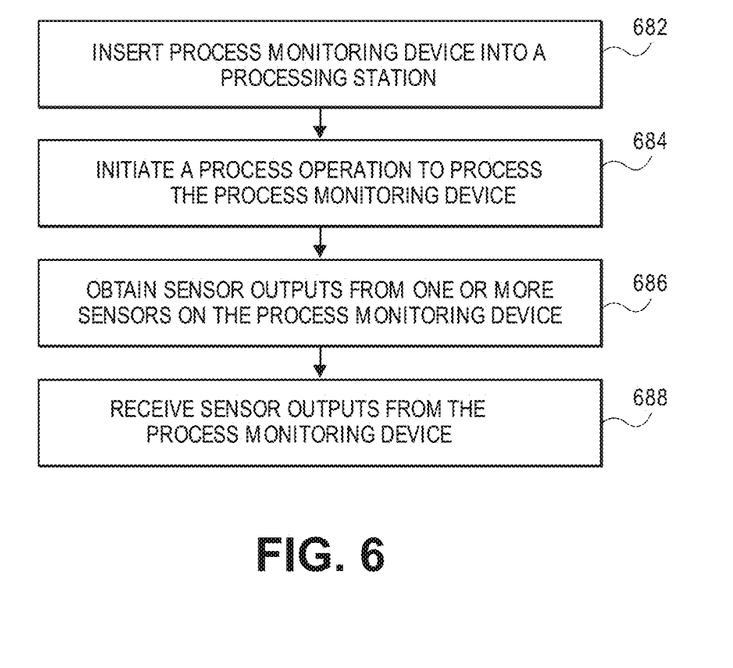
FIG. 6 is an illustration of a flowchart representing operations in a method for providing real time process characterization in a processing tool, in accordance with an embodiment.

Referring now to FIG. 6, an illustration of a flowchart representing operations in a method for monitoring process conditions on the substrate with a process monitoring device 100 in a substrate processing station is illustrated in accordance with an embodiment. At operation 682, process monitoring device 100 is inserted into a processing station (e.g., a chamber 568 of substrate processing tool 560). Process monitoring device 100 may have the structure and components described above (e.g., a plurality of sensor banks 108 with one or more sensors 219 mounted at predetermined locations on support surface 104, one or more patterned features 221, and a network interface for transmitting output signals obtained from the one or more sensors 219). Each of the sensors 219 may be configured to produce an output signal that corresponds to a process condition on the substrate surface or in the processing station.

At operation 682, a clock 374 on the process monitoring device 100 may be activated and synchronized with a clock associated with the processing station. For example, the clock 374 may be activated by an accelerometer 375 on the process monitoring device 100 detecting the deceleration to zero movement. Synchronizing the clock 374 on the process monitoring device 100 with a clock associated with the processing station allows for data from the processing chamber to be overlayed with data from the process monitoring device 100.

At operation 684, a processing operation to process the process monitoring device 100 is initiated. For example, the substrate processing station may receive a process recipe from the external computer 561. In an embodiment, the processing recipe may be for a deposition process, an etching process, an exposure process, or any other processing operation used in the fabrication of devices on substrates. According to an embodiment, the processing operation may be a processing operation that will be used on subsequently processed production substrates, or the processing operation may be a part of a DOE used to develop a new process recipe or refine a processing recipe. For example, the relationship between the VDC and surface temperature can be determined by running a process recipe that includes changes in the VDC and monitoring how the surface temperature changes in response to the change in VDC.

At operation 686, the process monitoring device 100 may obtain output signals from the one or more sensors 219 formed on the substrate 102. According to an embodiment, the output signals may correspond to a processing condition on the substrate 102 or in the processing station during the processing operation. For example, the output signals may correspond with film thickness, presence or absence of particles, mass, substrate temperature, chuck temperature, surface charge, magnetic field strength, specific gas concentration, EEDF of a plasma, VDC, or the like. In an embodiment, the output signals may be an output voltage, an output current, frequency, time measurement, or the like. In an embodiment, the output signals may be obtained continuously during the processing operation. Alternative embodiments may include obtaining obtained at preset intervals (e.g., every half second, every second, ever five seconds, etc.).

At operation 688, output signals are received from the process monitoring device 100. In an embodiment, the output signals may be received from a network interface device 371 on the process monitoring device 100. For example, an external computer 561 may receive the output signals over a wireless signal from the network interface device 371. Accordingly, real time analysis of the change in process conditions may be obtained. Additionally, the output signals may be overlayed with data obtained from sensors on the processing tool 560 in order to determine how changes to the process recipe alter the substrate. Alternative embodiments that include a processor 376 and a memory 378 on the process monitoring device may record the output signals to the memory 378. After the processing operation is completed, the information stored on the memory 378 may be downloaded to the external computer 561 for analysis.

Figure 7:
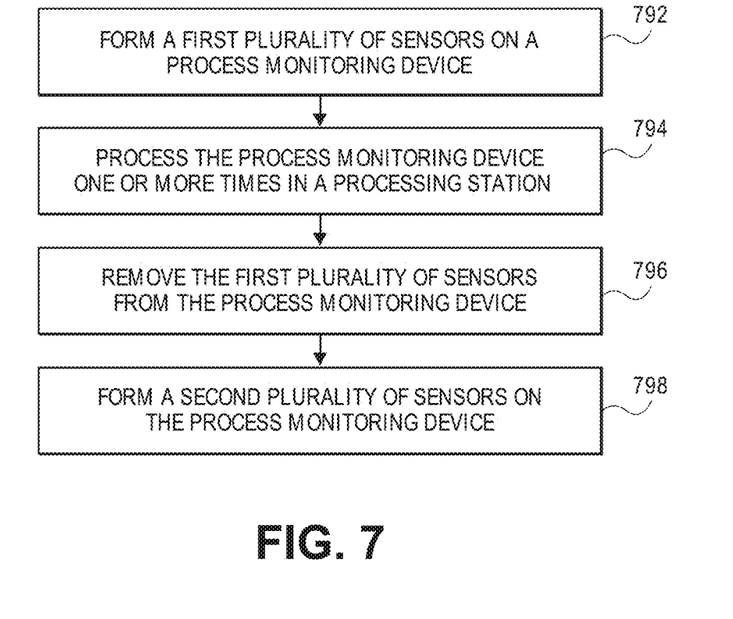
FIG. 7 is an illustration of a flowchart representing operations in a method for using and resurfacing a process monitoring device with a plurality of sensor banks, in accordance with an embodiment.

According to an additional embodiment, a process for using the process monitoring device 100 may include refurbishing the process monitoring device 100. A flowchart representing operations in such as process is illustrated in FIG. 7. At operation 792, a first plurality of sensors 219 may be formed on a surface 104 (or replaceable layer 105) of a process monitoring device. The first plurality of sensors may be substantially similar to the sensors 219 described above and may be formed with typical semiconductor manufacturing processes such as deposition and etching processes known in the art.

At operation 794 the process monitoring device 100 may be processed one or more times in a processing station (e.g., a processing chamber 568 of a processing tool 560). In an embodiment, the process monitoring device 100 may be processed a predetermined number of times corresponding to an expected useable lifespan of the first plurality of sensors 219. The expected useable lifespan of the first plurality of sensors 219 may be partially dependent on the types of processing operations that are performed on the process monitoring device 100. Alternatively, the process monitoring device 100 may undergo periodic inspection in order to verify the sensors 219 are still operational. Once the sensors are deemed non-operational (i.e., sufficiently damaged so that reliable data is no longer able to be obtained), or the predetermined number of processing operations have been performed, the process monitoring device 100 may be refurbished. Additional embodiments may include refurbishing the process monitoring device 100 when new types of sensors are needed, when the patterned features 221 need to be remanufactured or changed, or for any other reason.

At operations 796, the first plurality of sensors 219 may be removed from the process monitoring device 100. In an embodiment, removing the first plurality of sensors 219 may be done without damaging or removing the circuitry 113/116 or interconnect lines 114/115 on the process monitoring device 100. For example, the circuitry 113/116 and interconnect lines 114/115 may be embedded within the substrate 102, or may be resistant to an etching process used to remove the first plurality of sensors 219. Embodiments may also include removing a replaceable layer 105 when the first plurality of sensors 219 is removed.

At operation 798, a second plurality of sensors 219 may be formed on the process monitoring device 100. In an embodiment, the second plurality of sensors 219 may be the same type and/or number of sensors as the first plurality of sensors 219. Alternatively new sensor types may be included in the second plurality of sensors 219. The second plurality of sensors 219 may be formed in locations where the first plurality of sensors 219 were located in order to minimize or eliminate the need for forming new electrical interconnects 114/115 and or vias 117 to the circuitry 113/116 of the process monitoring device 100. In embodiments that include a replaceable layer 105, a second replaceable layer 105 may be formed over the support surface 104 prior to forming the second plurality of sensors 219. Accordingly, the process monitoring device 100 may have an extended usable life or be upgradable because the process monitoring device 100 can be refurbished.

Figure 8:
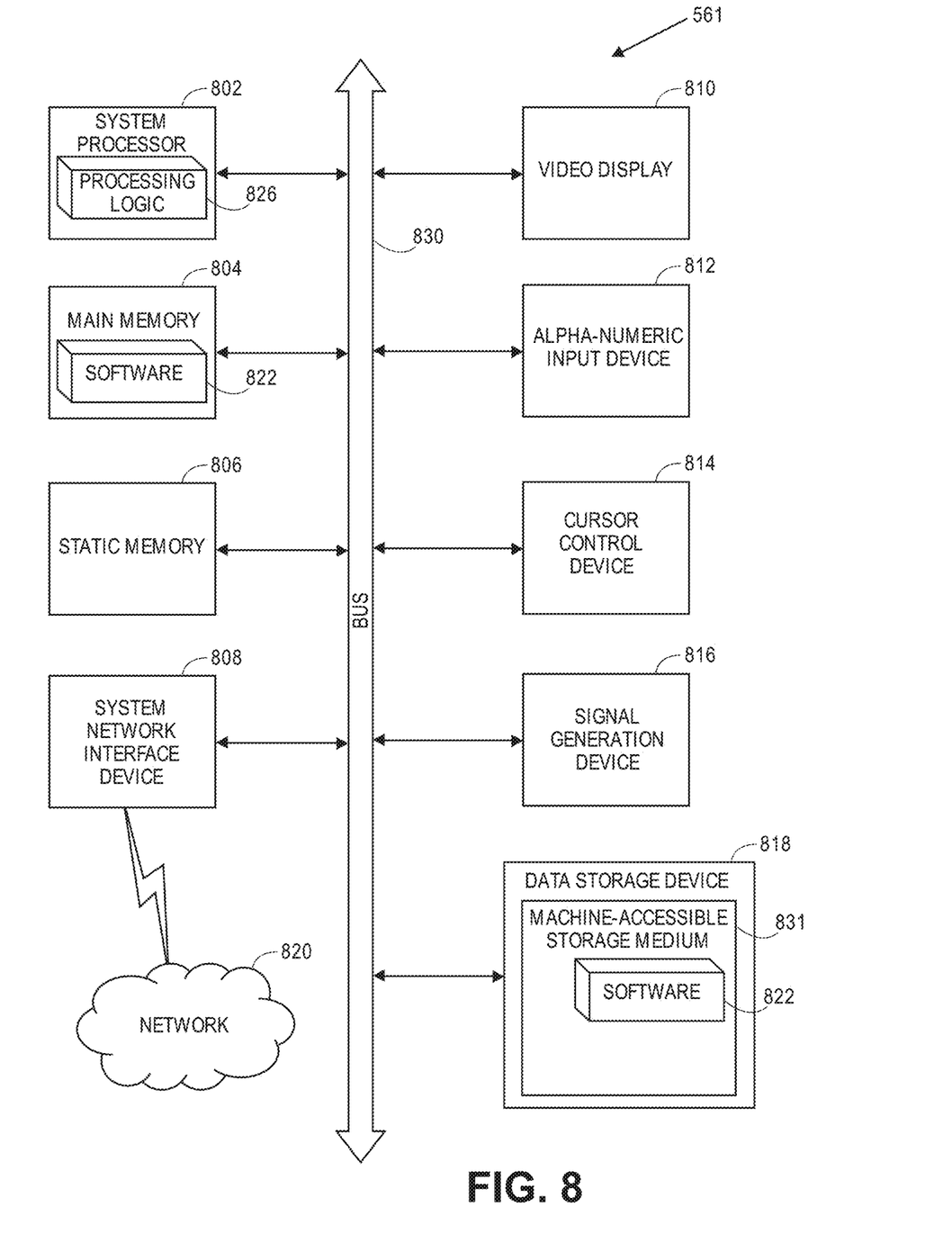
FIG. 8 illustrates a block diagram of an exemplary computer system that may be used in conjunction with a process monitoring device, in accordance with an embodiment.

Referring now to FIG. 8, a block diagram of an exemplary computer system 561 of a substrate processing tool 560 is illustrated in accordance with an embodiment. One or more components of the illustrated computer system 561 may be used in electronic circuitry 113/116 of process monitoring device 100. Furthermore, substrate processing tool 560 may incorporate computer system 561. In an embodiment, computer system 561 is coupled to and controls robots, load locks, processing chambers, and other components of substrate processing tool 560. Computer system 561 may also provide a system log file for substrate processing tool 560 as discussed above. Computer system 561 may also receive and analyze output signals obtained from process monitoring device 100. That is, the computer system 561 may be implemented in substrate processing tool 560 to control process operations of a wafer manufacturing process, generate a log file to record times and actions related to the process, and compare the log file of data recorded by process monitoring device 100 in order to determine how changes to processing conditions alter the processing conditions on the surface of the process monitoring device 100.

Computer system 561 may be connected (e.g., networked) to other machines in a Local Area Network (LAN), an intranet, an extranet, or the Internet. Computer system 561 may operate in the capacity of a server or a client machine in a client-server network environment, or as a peer machine in a peer-to-peer (or distributed) network environment. Computer system 561 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 561, the term "machine" shall also be taken to include any collection of machines (e.g., computers) that individually or jointly execute a set (or multiple sets) of instructions to perform any one or more of the methodologies described herein.

Computer system 561 may include a computer program product, or software 822, having a non-transitory machine-readable medium having stored thereon instructions, which may be used to program computer system 561 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 561 includes a system processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

System processor 802 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 802 may also be one or more special-purpose processing devices such as an application specific integrated circuit (ASIC), a field programmable gate array (FPGA), a digital signal system processor (DSP), network system processor, or the like. System processor 802 is configured to execute the processing logic for performing the operations described herein.

The computer system 561 may further include a system network interface device 808 for communicating with other devices or machines, e.g., process monitoring device 100. The computer system 561 may also include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium 831 (or more specifically a computer-readable storage medium) on which is stored one or more sets of instructions (e.g., software 822) embodying any one or more of the methodologies or functions described herein. The software 822 may also reside, completely or at least partially, within the main memory 804 and/or within the system processor 802 during execution thereof by the computer system 561, the main memory 804 and the system processor 802 also constituting machine-readable storage media. The software 822 may further be transmitted or received over a network 820 via the system network interface device 808.

While the machine-accessible storage medium 831 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A process monitoring device, comprising:
   a substrate;
   a plurality of sensors on a support surface of the substrate, wherein each sensor is capable of producing an output signal that corresponds to a processing condition;
   a plurality of patterned features over or into the support surface of the substrate, wherein corresponding ones of the plurality of patterned features are proximate to corresponding ones of the plurality of sensors, and wherein the plurality of patterned features is a plurality of fins; and a network interface device on the substrate, wherein each of the plurality of sensors is communicatively coupled to the network interface device.

2. The process monitoring device of claim 1, wherein the network interface device is not on the support surface of the substrate.

3. The process monitoring device of claim 2, wherein the network interface device is in a cavity in the substrate.

4. The process monitoring device of claim 3, wherein each of the sensors are communicatively coupled to the network interface device by a via structure.

5. The process monitoring device of claim 1, wherein the plurality of sensors are distributed across one or more zones on the support surface.

6. The process monitoring device of claim 1, wherein the plurality of sensors are grouped in a plurality of sensor banks.

7. The process monitoring device of claim 6, wherein each sensor bank includes more than one sensor, and wherein each sensor bank includes one or more different types of sensors.

8. The process monitoring device of claim 7, wherein at least one of the sensors is a transistor sensor.

9. The process monitoring device of claim 7, wherein at least one of the sensors is a resonator sensor.

10. The process monitoring device of claim 1, wherein the output signals are voltages, currents, frequencies, or time measurements, and wherein the processing conditions include one or more of a film thickness, presence or absence of particles, mass, substrate temperature, chuck temperature, surface charge, magnetic field strength, specific gas concentration, electron energy distribution function (EEDF) of a plasma, or VDC.

11. The process monitoring device of claim 1, further comprising:
a replaceable layer on the support surface.

12. A system for monitoring a processing operation, comprising:
a processing tool that includes one or more processing stations;
a process monitoring device that is sized to be processed in one or more of the processing stations, comprising:
a substrate;
a plurality of sensors on a support surface of the substrate, wherein each sensor is capable of producing an output signal that corresponds to a processing condition;
a plurality of patterned features over or into the support surface of the substrate, wherein corresponding ones of the plurality of patterned features are proximate to corresponding ones of the plurality of sensors, and wherein the plurality of patterned features is a plurality of fins; and
a network interface device on the substrate, wherein each of the plurality of sensors is communicatively coupled to the network interface device; and
a computer communicatively coupled to the process monitoring device by the network interface device.

13. The system for monitoring a processing operation of claim 12, wherein the output signals are voltages, currents, frequencies, or time measurements, and wherein the processing conditions include one or more of a film thickness, presence or absence of particles, a mass, a substrate temperature, a chuck temperature, a surface charge, a magnetic field strength, a specific gas concentration, an electron energy distribution function (EEDF) of a plasma, or VDC.

14. The system for monitoring a processing operation of claim 12, further comprising:
a replaceable layer on the support surface.

* * * * *